United States Patent [19]
Lee et al.

[11] Patent Number: 6,075,713
[45] Date of Patent: Jun. 13, 2000

[54] LASER TRIMMABLE ELECTRONIC DEVICE

[75] Inventors: Chye Lin Lee, Relau; Ah Kow Mah, Penang; Chong Meng Lee, Sungai Petani. Kedah, all of Malaysia

[73] Assignee: Motorola, Inc., Schaumburg, Ill.

[21] Appl. No.: 08/843,425

[22] Filed: Apr. 15, 1997

[51] Int. Cl.[7] .............................. H03H 7/00; H05K 7/00; H01G 4/38
[52] U.S. Cl. ...................... 361/821; 361/301.1; 361/309; 361/329; 333/184
[58] Field of Search ................................. 361/301.3, 303, 361/304, 306.1, 306.3, 308.1, 309, 310, 312, 313, 321.2, 329, 330, 765, 766, 782, 811, 816, 818.821; 29/25.42; 338/275, 306, 307, 308; 336/82, 83, 200; 257/301, 303, 306, 296, 528, 530–533; 333/185, 205, 235

[56] References Cited

U.S. PATENT DOCUMENTS

| | | | |
|---|---|---|---|
| 4,905,358 | 3/1990 | Einbinder | 29/25.52 |
| 5,159,524 | 10/1992 | Hasegawa et al. | 361/271 |
| 5,345,361 | 9/1994 | Billotte et al. | 361/313 |
| 5,600,296 | 2/1997 | Kuzuoka et al. | 338/22 R |
| 5,604,658 | 2/1997 | Pedder | 361/277 |

*Primary Examiner*—Bot L. Ledynh
*Assistant Examiner*—Anthony Dinkins
*Attorney, Agent, or Firm*—Dale W. Dorinski

[57] ABSTRACT

A laser trimmable electronic device (1) has a housing (2) and a partially enclosed component (3) at least partially enclosed inside the housing (2) and electrically coupled to external connector terminals (4,5). The device (1) has a laser trimmable component (6) electrically coupled the external connector terminals (4,5), wherein at least part of the trimmable component (6) is mounted to an outer surface (7) of the housing (2).

16 Claims, 3 Drawing Sheets

6,075,713

LASER TRIMMABLE ELECTRONIC DEVICE

FIELD OF THE INVENTION

This invention relates to a laser trimmable electronic device.

BACKGROUND ART

In general, laser trimmable components are formed as an individual trimmable unit that is formed or directly connected to a printed circuit board. Alternatively, laser trimmable components can be encapsulated in a hybrid circuit.

If the laser trimmable component is an individual component that is directly connected to a printed circuit board, valuable circuit board real estate must be used which in certain circumstances may be unacceptable.

In contrast, hybrid circuits have the advantages of reducing circuit board real estate as a number of components can be incorporated onto a thin or thick film substrate which can be mounted normal to the plane of the circuit board to thereby save space. The trimmable components on the substrate are trimmed before all components of the hybrid circuit are encapsulated in an epoxy coating. Unfortunately, due to tolerances of components on the circuit board, the pre trim values of the laser trimmable components of the hybrid circuit may be inadequately calibrated and in situ fine trimming of these components is generally not possible as they are encapsulated in the epoxy coating. This therefore requires the complete hybrid circuit to be removed and replaced with another hybrid circuit in the hope that the trimmable values may be adequately calibrated for use with the non-trimmable components mounted on the circuit board.

SUMMARY OF THE INVENTION

It is an aim of this invention to provide a laser trimmable electronic device which overcomes or alleviates at least one of the problems or disadvantages associated with prior art laser trimmable electronic devices.

According to one aspect of the invention there is provided a laser trimmable electronic device comprising:

a housing;

at least one partially enclosed component having conductive or semiconductive properties, said enclosed component being at least partially enclosed inside said housing and electrically coupled to external connector terminals of said device; and at least one laser trimmable component electrically coupled to external connector terminals of said component, wherein at least part of said trimmable component is mounted to an outer surface of said housing.

Preferably, at least part of said trimmable component may be mounted directly to said outer surface. Suitably, said trimmable component may be an inductor. Alternatively, said trimmable component may preferably be a capacitor.

Suitably, all electrodes of said capacitor may be mounted to said outer surface. Alternatively, only one of said electrodes of said capacitor may be mounted to said outer surface and another one of said electrodes is enclosed in said housing, wherein said electrode mounted to said outer surface is laser trimmable.

Suitably, said housing may comprise a plurality of insulating members.

Preferably, two of said insulating members may sandwich said enclosed component therebetween.

Suitably, the another one of said electrodes enclosed in said housing may be sandwiched between two of said insulating members.

Preferably, there may be a conductive shield enclosed in said housing; said shield being sandwiched between two of said insulating members.

Suitably, said enclosed component and said trimmable component may be electrically coupled to at least one common one of said external connector terminals.

Suitably, said enclosed component and said trimmable component may be electrically coupled in series.

Alternatively, said enclosed component and said trimmable component may preferably be electrically coupled in parallel.

Preferably, said at least part of said trimmable component may be mounted to an outer surface opposing a surface from which at least one of said connector terminals extends therefrom.

Suitably, said device may be mounted to a circuit board.

BRIEF DESCRIPTION OF THE DRAWINGS

In order that the invention may be readily understood and put into practical effect, reference will now be made to preferred embodiments illustrated in the accompanying drawings in which.

DETAILED DESCRIPTION OF THE PREFERRED EMBODIMENT OF THE INVENTION

Figure 1:
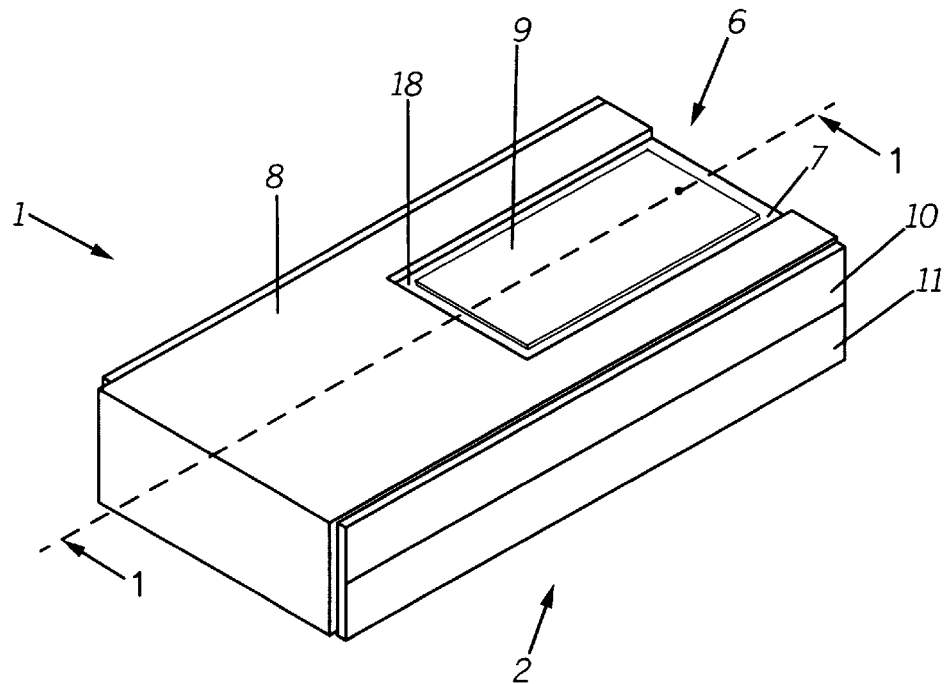
FIG. 1 is a perspective view of a laser trimmable electronic device in accordance with a first embodiment of the invention.
Figure 2:
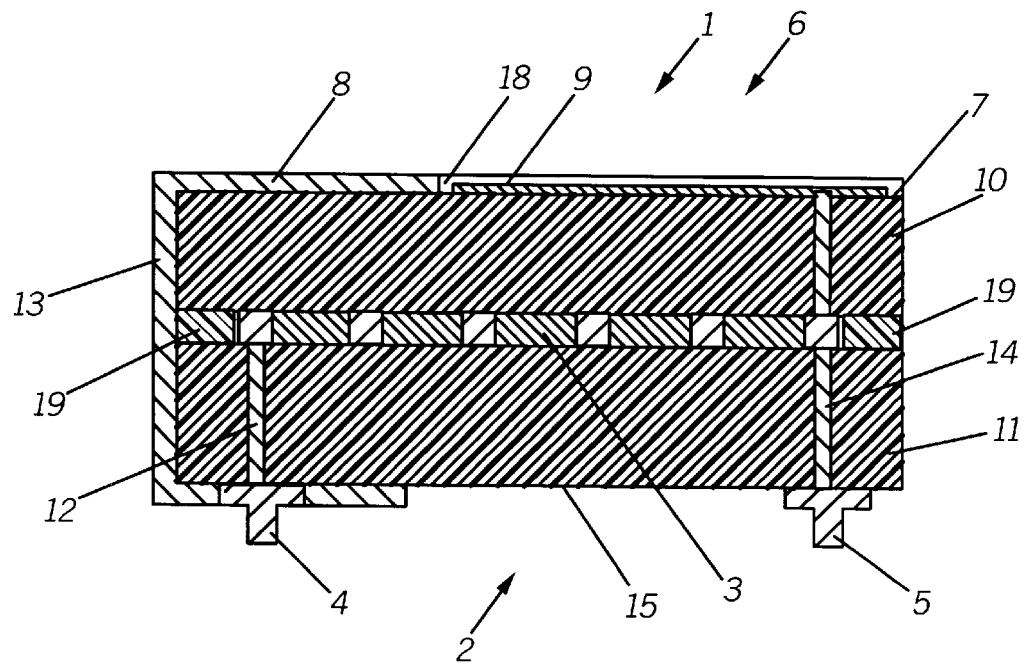
FIG. 2 is a cross sectional front view of FIG. 1 through A—A.
Figure 3:
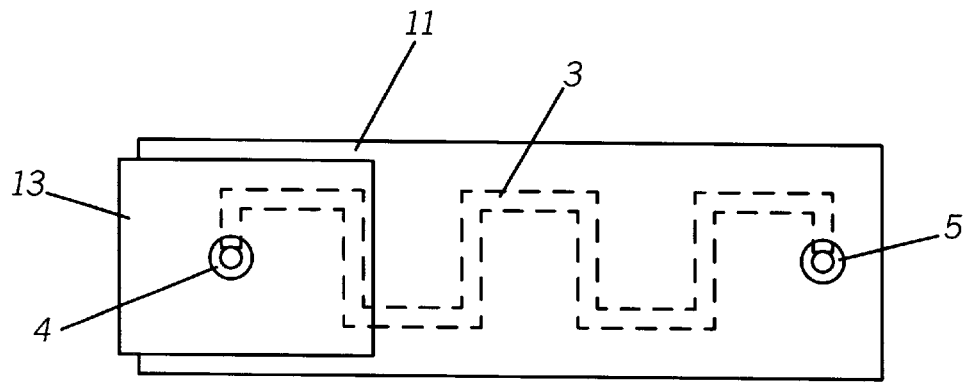
FIG. 3 is an underside plan view of the laser trimmable electronic device illustrated in FIG. 2.

Referring to FIGS. 1 to 3 there illustrated a trimmable electronic device 1 comprising a housing 2 and an enclosed component in the form of an inductor 3 enclosed inside housing 2. Inductor 3 is electrically coupled to external connector terminals 4, 5. The trimmable electronic device 1 also comprises a laser trimmable component in the form of a capacitor 6 mounted to an outer surface 7 of housing 2. The capacitor 6 comprises two electrodes 8, 9 mounted directly to outer surface 7. Electrode 9 is laser trimmable as will be apparent to a person skilled in the art and an air gap 18 and an area of an insulating substrate 10 adjacent air gap 18 provides a dielectric for capacitor 6.

Housing 2 comprises two insulating substrates 10, 11 enclosing inductor 3. In this regard, inductor 3 is printed or deposited on substrate 11 and sandwiched between substrates 10 and 11. Further, a resin 19 is deposited to assist in filling a gap around the periphery of inductor 3. As illustrated, an end of inductor 3 and electrode 8 are connected to external connector terminal 4, inductor 3 is connected to terminal 4 by a pin 12 and electrode 8 is connected by an extension plate 13 wrapped around part of housing 2. The other end of inductor 3 and electrode 9 are connected to external connector terminal 5 by a common pin 14. The actual connections of pins 12, 14 and the extension plate 13 to the respective external connector terminals 4,5 will be apparent to a person skilled in the art and therefore needs no explanation.

Outer surface 7 is opposite to an outer surface 15 from which external terminals 4, 5. Accordingly, when the trimmable device 1 is mounted by external connector terminals 4, 5 to a printed circuit board, relatively easy and uncumbered access of a trimmable laser beam is achieved to thereby trim electrode 9.

Figure 4:
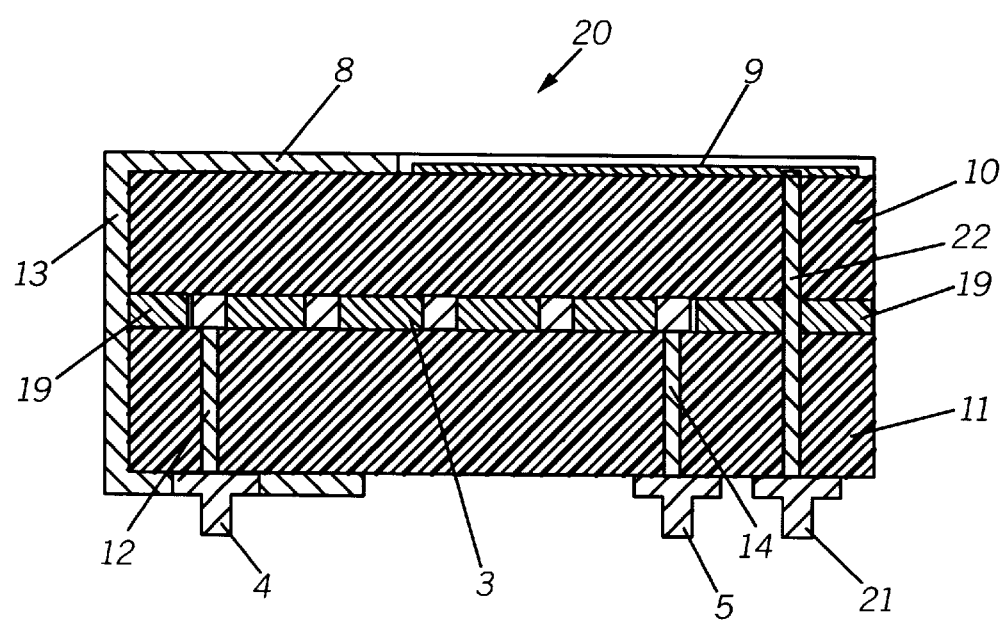
FIG. 4 is a cross sectional front view of a second embodiment of the invention.

The embodiment of FIG. 4 is similar to the embodiment of FIGS. 1 to 3 and therefore all alike components have been identified by the same numerals. In the embodiment in FIG. 4 there is illustrated a trimmable electronic device 20 which differs from electronic device 1 by there being an extra external connector terminal 21 which is connected to trimmable electrode 9 by a pin 22. Further, pin 14 is only connected to an end of inductor 3 and there is no connection of external connector terminal 5 to trimmable electrode 9. As a result, in FIG. 1 the device 1 is configured to be a parallel inductor capacitor network whereas the device 20 is configured to be a series inductor capacitor network.

Figure 5:
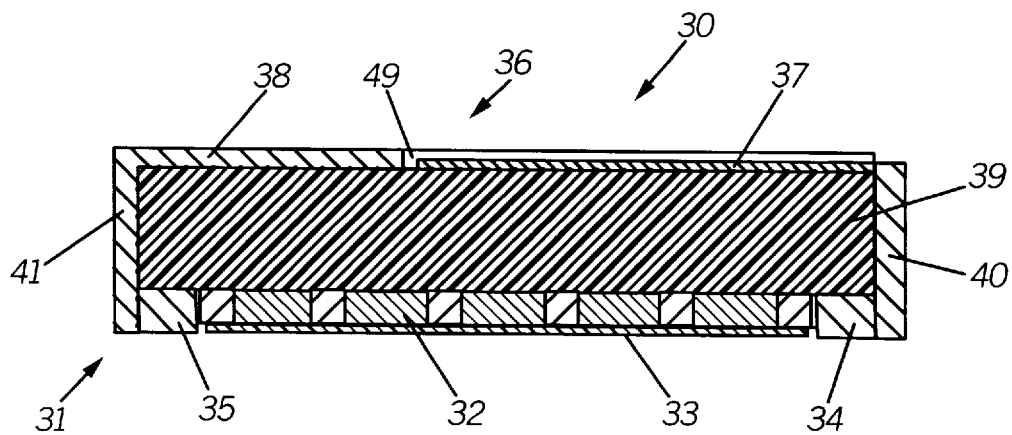
FIG. 5 is a cross sectional front view of a third embodiment of the invention.

Referring to FIG. 5 there is illustrated a third embodiment of a trimmable electronic device 30 comprising a housing 31 and an enclosed component in the form of an inductor 32 partially enclosed inside housing 31. Housing 31 comprises a substrate 39 and solder resist material 33. Inductor 32 is electrically coupled to external connector terminals 34, 35. The trimmable electronic device 30 also comprises a laser trimmable component in the form of a capacitor 36 mounted to an outer surface of housing 31. The capacitor 36 comprises two electrodes 37, 38 mounted to an outer surface of housing 31. Electrode 37 is a laser trimmable electrode and an air gap 49 and an area of substrate 39 adjacent air gap 49 provides a dielectric for capacitor 36.

Inductor 32 is printed or deposited on a surface of substrate 39 and is sandwiched between substrate 39 and solder resist material 33. An end of inductor 32 is directly coupled to external connector terminal 35, the other end of inductor 32 is directly coupled to external connector terminal 34. Furthermore, electrode 37 is coupled by an extension plate 40 to external connector terminal 34, whereas electrode 38 is coupled by an extension plate 41 to external connector terminal 35. Accordingly, the trimmable electronic device 30 is in the form of a parallel inductor capacitor network.

Figure 6:
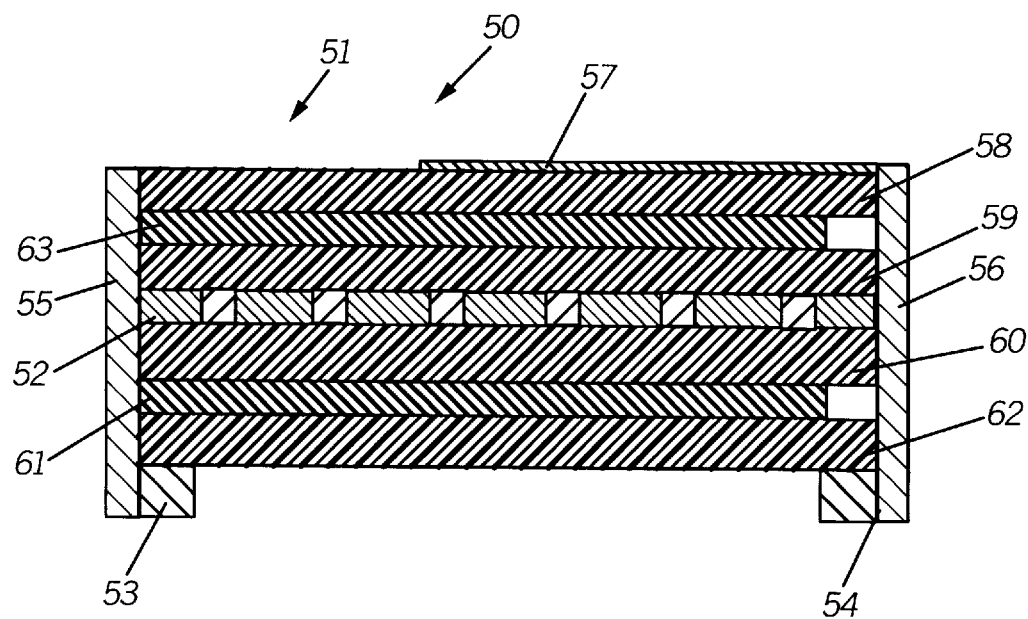
FIG. 6 is a cross sectional front view of a fourth embodiment of the invention.

Referring to FIG. 6, there is illustrated a fourth embodiment of a trimmable electronic device 50. The trimmable electronic device 50 comprises a housing 51 and an enclosed component in the form of an inductor 52 enclosed inside housing 51. Ends of inductor 52 are electrically coupled to external connector terminals 53, 54 by respective conductive end plates 55, 56. The trimmable electronic device 50 also comprises a laser trimmable component in the form of a capacitor having a trimmable electrode 57 mounted to an outer surface of housing 51, the second electrode 63 of the capacitor is sandwiched between two insulating substrates 58, 59 of the housing 51. Accordingly, substrate 58 provides a dielectric between electrodes 57 and 63. Furthermore, inductor 52 is printed or deposited on an underside of substrate 59 and is sandwiched between substrate 59 and a third insulating substrate 60.

The electronic device 50 also comprises a conductive ground plane 61 sandwiched between substrate 60 and a fourth substrate 62. Electrode 63 and ground plane 61 are electrically connected to end plate 55 thereby coupling both ground plane 61 and electrode 63 to external connector terminal 53. Accordingly, the trimmable electronic component 50 is a parallel inductor capacitor network having a ground plane 61 providing a conductive shield for reducing radio frequency interference.

Advantageously, the present invention can be mounted to a printed circuit board in which the external connector terminals electrically couple the trimmable electronic device to other components. The trimmable electrode on the surface of the device can then be trimmed by a laser beam. In this regard, when devices 1, 20 or 30 are trimmed the air gap between both electrodes is increased thereby altering the capacitance of the trimmable component. In contrast, when laser trimming component 50, a reduction in surface area of electrode 57 alters the capacitance of the device.

The present invention provides for in situ adjustment or trimming of a component comprising two or more components of a single device when mounted to a circuit board. Accordingly, one or more problems or disadvantages associated with hybrid or individual laser trimmable components are at least alleviated.

Although the invention has been described with the reference to the preferred embodiments, it is to be understood that the invention is not limited to any one of the embodiments described herein. For instance, an inductor could be mounted on an outer surface for laser trimming and the capacitor could be enclosed in the housing

What is claimed is:
1. A laser trimmable electronic device comprising:
   a housing;
   at least one partially enclosed inductor at least partially enclosed inside said housing and electrically coupled to one or more external connector terminals of said device; and
   at least one laser trimmable capacitor electrically coupled to said external connector terminals of said device, wherein at least part of said laser trimmable capacitor is mounted to an outer surface of said housing.
2. A laser trimmable electronic device as claimed in claim 1, wherein at least part of said laser trimmable capacitor is mounted directly to said outer surface.
3. A laser trimmable electronic device as claimed in claim 1, wherein said capacitor has electrodes, and all of said electrodes are mounted to said outer surface.
4. A laser trimmable electronic device as claimed in claim 1, wherein said capacitor has electrodes, and one of said electrodes is mounted to said outer surface and a second one of said electrodes is enclosed in said housing,
   wherein said one of said electrodes mounted to said outer surface is laser trimmable.
5. A laser trimmable electronic device as claimed in claim 4, wherein the second one of said electrodes enclosed in said housing may be sandwiched between two insulating members.
6. A laser trimmable electronic device as claimed in claim 1, wherein said housing comprises a plurality of insulating members.
7. A laser trimmable electronic device as claimed in claim 6, wherein two of said insulating members sandwich said enclosed component therebetween.
8. A laser trimmable electronic device as claimed in claim 7, wherein there is a conductive shield enclosed in said housing, said shield being sandwiched between two of said insulating members.
9. A laser trimmable electronic device as claimed in claim 1, wherein said enclosed inductor and said trimmable capacitor are electrically coupled to at least one common one of said external connector terminals.

10. A laser trimmable electronic device as claimed in claim 1, wherein said enclosed inductor and said trimmable capacitor are electrically coupled in series.

11. A laser trimmable electronic device as claimed in claim 1, wherein said enclosed inductor and said trimmable capacitor are electrically coupled in parallel.

12. A laser trimmable electronic device as claimed in claim 1, wherein said at least part of said trimmable capacitor is mounted to said outer surface, said outer surface opposing a surface from which at least one of said connector terminals extends therefrom.

13. A laser trimmable electronic device as claimed in claim 1, wherein said device is mounted to a circuit board.

14. A laser trimmable electronic device comprising:

a housing;

at least one partially enclosed capacitor at least partially enclosed inside said housing and electrically coupled to one or more external connector terminals of said device; and at least one laser trimmable inductor electrically coupled to said external connector terminals of said device, wherein at least part of said trimmable inductor is mounted to an outer surface of said housing.

15. A laser trimmable electronic device as claimed in claim 14, wherein at least part of said laser trimmable inductor is mounted directly to said outer surface.

16. A laser trimmable electronic device as claimed in claim 14 wherein said device is mounted to a circuit board.

* * * * *